(12) United States Patent
Wall et al.

(10) Patent No.: US 9,437,630 B2
(45) Date of Patent: Sep. 6, 2016

(54) SEMICONDUCTOR PHOTOMULTIPLIER

(71) Applicant: SensL Technologies Ltd., Cork (IE)

(72) Inventors: Liam Wall, Glounthaune (IE); Kevin O'Neill, Cork (IE); John Carlton Jackson, Cobh (IE)

(73) Assignee: SensL Technologies Ltd., Cork (IE)

( * ) Notice: Subject to any disclaimer, the term of this patent is extended or adjusted under 35 U.S.C. 154(b) by 0 days.

(21) Appl. No.: 14/283,006

(22) Filed: May 20, 2014

(65) Prior Publication Data

US 2015/0340390 A1 Nov. 26, 2015

(51) Int. Cl.
*H01L 31/107* (2006.01)
*H01L 27/144* (2006.01)
*H01L 31/115* (2006.01)

(52) U.S. Cl.
CPC ......... *H01L 27/1446* (2013.01); *H01L 31/107* (2013.01); *H01L 31/115* (2013.01)

(58) Field of Classification Search
CPC ..................................... H01L 31/107
See application file for complete search history.

(56) References Cited

U.S. PATENT DOCUMENTS

| | | | | |
|---|---|---|---|---|
| 4,575,629 A | * | 3/1986 | Schnell | G01J 3/44 250/238 |
| 6,150,185 A | * | 11/2000 | Lee | B24B 37/013 257/E21.528 |
| 2011/0108702 A1 | * | 5/2011 | Jackson et al. | 250/207 |

* cited by examiner

*Primary Examiner* — Yu-Hsi D Sun
(74) *Attorney, Agent, or Firm* — Shumaker & Sieffert, P.A.

(57) ABSTRACT

The present disclosure relates to photon detectors. In particular, the present disclosure relates to high sensitivity photon detectors such as semiconductor photomultipliers. A semiconductor photomultiplier is described which comprises an array of interconnected photosensitive microcells; and at least one dark count rate (DCR) suppression element associated with the array.

31 Claims, 11 Drawing Sheets

SEMICONDUCTOR PHOTOMULTIPLIER

FIELD OF THE INVENTION

The present disclosure relates to photon detectors. In particular, the present disclosure relates to high sensitivity photon detectors such as semiconductor photomultipliers. In particular, but not exclusively, the present disclosure relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SiPMs are semiconductor photon sensitive devices made up of an array of very small Geiger-mode avalanche photodiode (APD) cells on a substrate such as silicon. An example 10×10 microcell array is shown in FIG. 1 of the accompanying drawings. Each cell is connected to one another to form one larger device with one signal output. The entire device size can be as small as 1×1 mm or much larger. FIG. 2 of the accompanying drawings is a schematic diagram of a conventional silicon photomultiplier.

APD cells vary in dimension from 10 to 100 microns depending on the mask used, and can have a density of up to 3000 microcells/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 µm, requires cooling to reduce dark currents, and can achieve a very low level of excess noise.

Silicon avalanche diodes can function with breakdown voltages of 20 to 500V, typically. APDs exhibit internal current gain effect of about 100-1000 due to impact ionization, or avalanche effect, when a high reverse bias voltage is applied (approximately 20-200 V in silicon, depending on the doping profile in the junction). Silicon PhotoMultipliers or SiPMs can achieve a gain of $10^5$ to $10^6$ by using Geiger mode APDs which operate with a reverse voltage that is greater than the breakdown voltage, and by maintaining the dark count event rate at a sufficiently low level. The current generated by an avalanche event must be quenched by an appropriate current limited scheme so that the device can recover and reset after an avalanche event.

Noise ultimately imposes a limit on the smallest signal that can be measured. The main source of noise in an SiPM is the dark count rate (DCR), which is primarily due to thermally generated electrons that go on to create an avalanche in the high field region.

There is therefore a need to provide a semiconductor photomultiplier which addresses at least some of the drawbacks of the prior art.

SUMMARY

These and other problems are addressed by providing a semiconductor photomultiplier having an array of interconnected photosensitive cells; and at least one dark count rate (DCR) suppression element associated with the array.

In one aspect the at least one DCR suppression element comprises a photosensitive element. In one example, the at least one DCR suppression element comprises a photosensitive cell which has the same layout as an individual interconnected photosensitive microcell.

In another aspect the at least one DCR suppression element comprises a microcell.

In one aspect the at least one DCR suppression element is located adjacent the array. In one example, the at least one DCR suppression element is located in the array.

In a further aspect, a plurality of DCR suppression elements are provided. In one example, the plurality of DCR suppression elements define a discontinuous configuration which at least partially surrounds the array.

In one aspect the plurality of DCR suppression elements are dummy elements which are not coupled to power tracks.

In another aspect, the plurality of DCR suppression elements are dummy elements which are formed by photolithographic mask options to isolate or otherwise alter the electrical properties of chosen microcells to render them inactive.

In a further aspect, at least some of the plurality of DCR suppression elements are selectively controllable for configuring selected elements to be dummy elements.

In one aspect, the plurality of DCR suppression elements define multiple sub-arrays which are independently controllable.

In a further aspect, each sub-array is operably coupled between a cathode node and an anode node. In one exemplary configuration, at least two sub-arrays are operably coupled between different cathode and anode nodes.

In another aspect each microcell comprises a photodiode. In one example, each microcell comprises a resistor coupled in series to the photodiode. Optionally, the microcell further comprises a capacitive element.

In an exemplary arrangement the DCR suppression elements define a continuous configuration. Optionally, the DCR suppression element comprises a buried trench filled with a filling material.

In one aspect a plurality of discrete arrays of microcells are provided.

In a further aspect the DCR suppression element is provided by spacing the discrete arrays apart from each other by a distance which is less than the width of a single microcell.

In another aspect the interconnected photosensitive cells are arranged in a grid configuration. Optionally, the DCR suppression elements are arranged adjacent the outer periphery of the grid configuration.

In one aspect one or more additional DCR elements are associated with the corners of the grid configuration.

In another aspect each photosensitive cell comprises an avalanche photodiode. Optionally, each interconnected photosensitive cells comprises an quench resistor coupled in series to the avalanche photodiode. In one example, each interconnected photosensitive cell further comprises a capacitive element.

In one aspect the photosensitive cells define an active area and the DCR suppression elements define an inactive area. Optionally, the active area has a footprint shaped to conform with the footprint of a cross sectional area of an optical fibre. In one arrangement the active area has a circular footprint for facilitating coupling with the optical fibre.

In one exemplary arrangement, each microcell comprises a circuit element configured to provide a resistive load.

The present disclosure also relates to a substrate comprising:

an array of interconnected photosensitive microcells; and at least one dark count rate (DCR) suppression element associated with the array.

Additionally the disclosure relates to a method of fabricating a semiconductor photomultiplier; the method comprising:

providing a plurality of photosensitive cells on a substrate, and providing at least one DCR suppression element associated with the array.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

Figure 1:
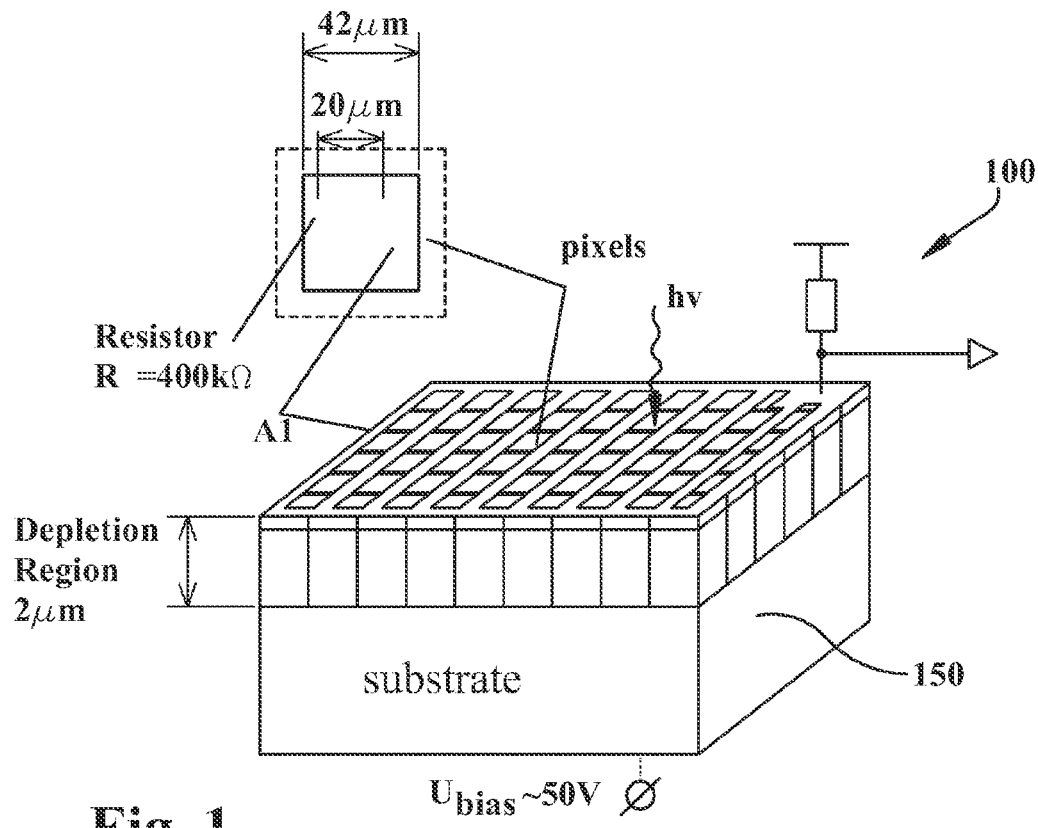
FIG. 1 illustrates an exemplary structure of a silicon photomultiplier.

The present disclosure will now be described with reference to some exemplary semiconductor photomultipliers. It will be understood that the exemplary semiconductor photomultipliers are provided to assist in an understanding of the teaching and is not to be construed as limiting in any fashion. Furthermore, circuit elements or components that are described with reference to any one Figure may be interchanged with those of other Figures or other equivalent circuit elements without departing from the spirit of the present teaching. It will be appreciated that for simplicity and clarity of illustration, where considered appropriate, reference numerals may be repeated among the figures to indicate corresponding or analogous elements.

Figure 2:
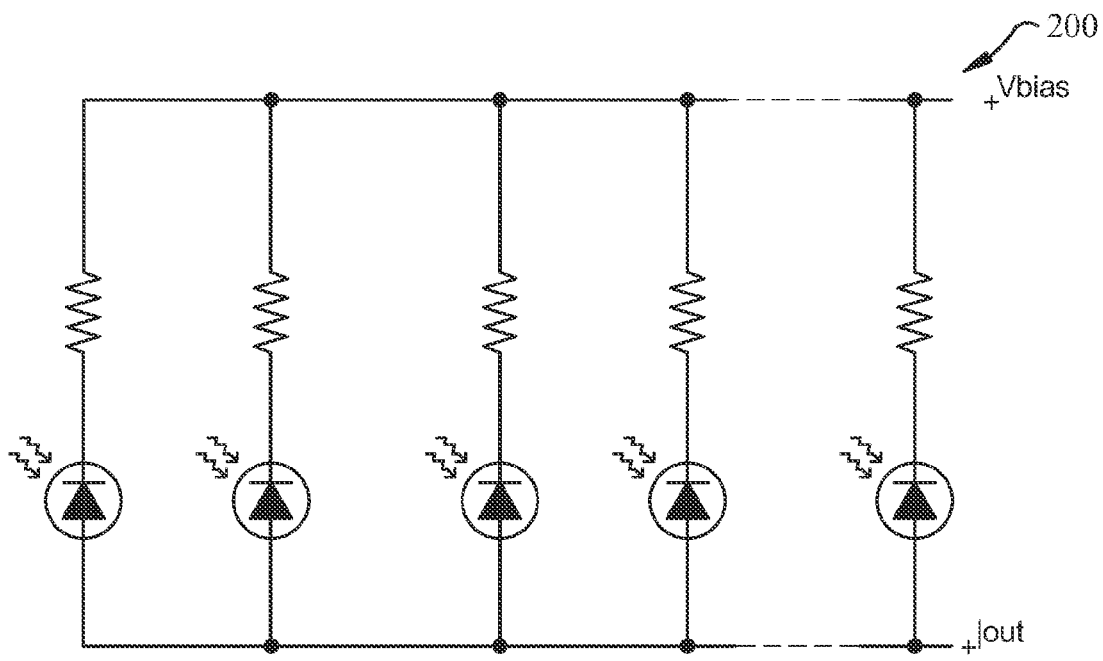
FIG. 2 is a schematic circuit diagram of an exemplary silicon photomultiplier.

Referring initially to FIG. 1, a silicon photomultiplier 100 comprising an array of Geiger mode photodiodes is shown. The array is formed on a semiconductor substrate 150 using semiconductor processes which will be known to one skilled in the art and may include for example, but not limited to, deposition, implantation, diffusion, patterning, doping, and etching. Patterned layers of conducting material, insulating material and doped areas of semiconductor form the structure of the photodiode. As illustrated, a quench resistor is provided adjacent to each photodiode which may be used to limit the avalanche current. The photodiodes are electrically connected to common biasing and ground electrodes by aluminium or similar conductive tracking An equivalent circuit schematic is shown in FIG. 2 for a conventional silicon photomultiplier 200 in which the anodes of an array of photodiodes are connected to a common ground electrode and the cathodes of the array are connected via current limiting resistors to a common bias electrode for applying a bias voltage across the diodes.

Figure 3:
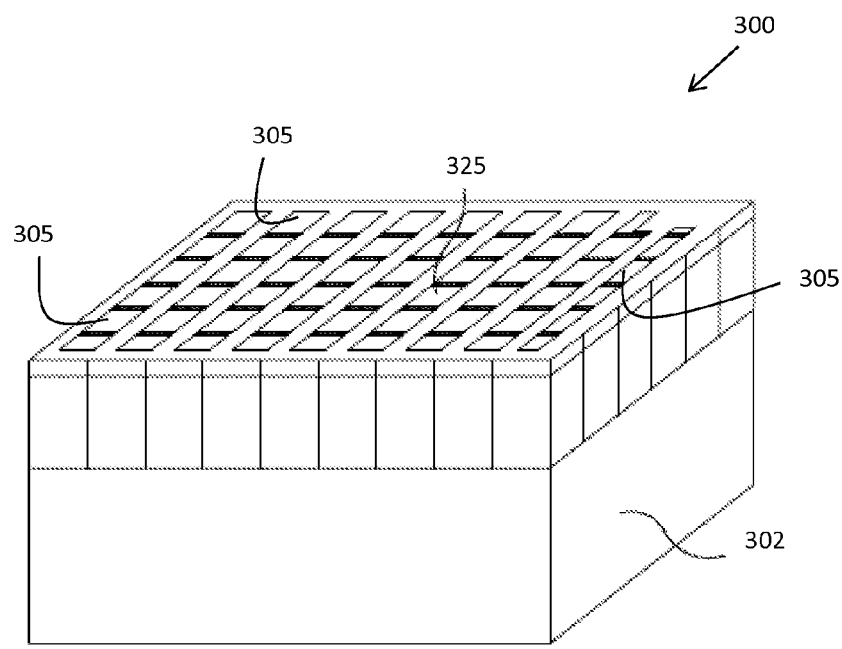
FIG. 3 is a perspective view of an exemplary photomultiplier in accordance with the present disclosure.

Referring to FIG. 3 there is provided a silicon photomultiplier 300 in accordance with the present disclosure. The silicon photomultiplier 300 is similar to the silicon photomultiplier 100 with the exception that DCR suppression elements 305 are provided which mitigates the effect of local mask density variations and results in lower DCR noise. The Silicon Photomultiplier 300 integrates a dense array of small, electrically and optically isolated Geigermode photodiodes 315. Each photodiode 315 is coupled in series to a quench resistor 320. Each photodiode 315 and its associated quench resistor 320 are referred to as a microcell 325. The number of microcells 325 typically number between 100 and 3000 per mm². The signals of all microcells 325 are then summed to form the output of the SiPM 300. A simplified electrical circuit 330 is provided to illustrate the concept in FIG. 4A. Each microcell 325 detects photons identically and independently. The sum of the discharge currents from each of these individual binary detectors combines to form a quasi-analog output, and is thus capable of giving information on the magnitude of an incident photon flux.

Each microcell 325 generates a highly uniform and quantized amount of charge every time the microcell 325 undergoes a Geiger breakdown. The gain of a microcell 325 (and hence the detector) is defined as the ratio of the output charge to the charge on an electron. The output charge can be calculated from the over-voltage and the microcell capacitance.

$$G = \frac{C \cdot \Delta V}{q}$$

Where:

G is the gain of the microcell;

C is the capacitance of the microcell;

$\Delta V$ is the over-voltage; and q is the charge of an electron.

Noise is a general term that may cover all sources of unwanted signal in the system and is superimposed onto the measured signal. The noise ultimately imposes a limit on the smallest signal that can be measured. The main source of noise in an SiPM is the dark count rate (DCR), which is primarily due to thermally generated electrons that go on to create an avalanche in the high field region. The DCR is the average rate of registered counts without any incident light. The DCR determines the minimum count rate at which the current signal is dominantly caused by real photons. The signals resulting from the breakdown of the microcell 325, due to either photoelectrons or thermally generated electrons, are identical. Therefore, these electrons form a source of noise at the single photon level. If a threshold can be set above the single photon level, false triggers from the noise can be avoided, but the dark counts will always form a contribution to the measured signal.

Figure 4A:
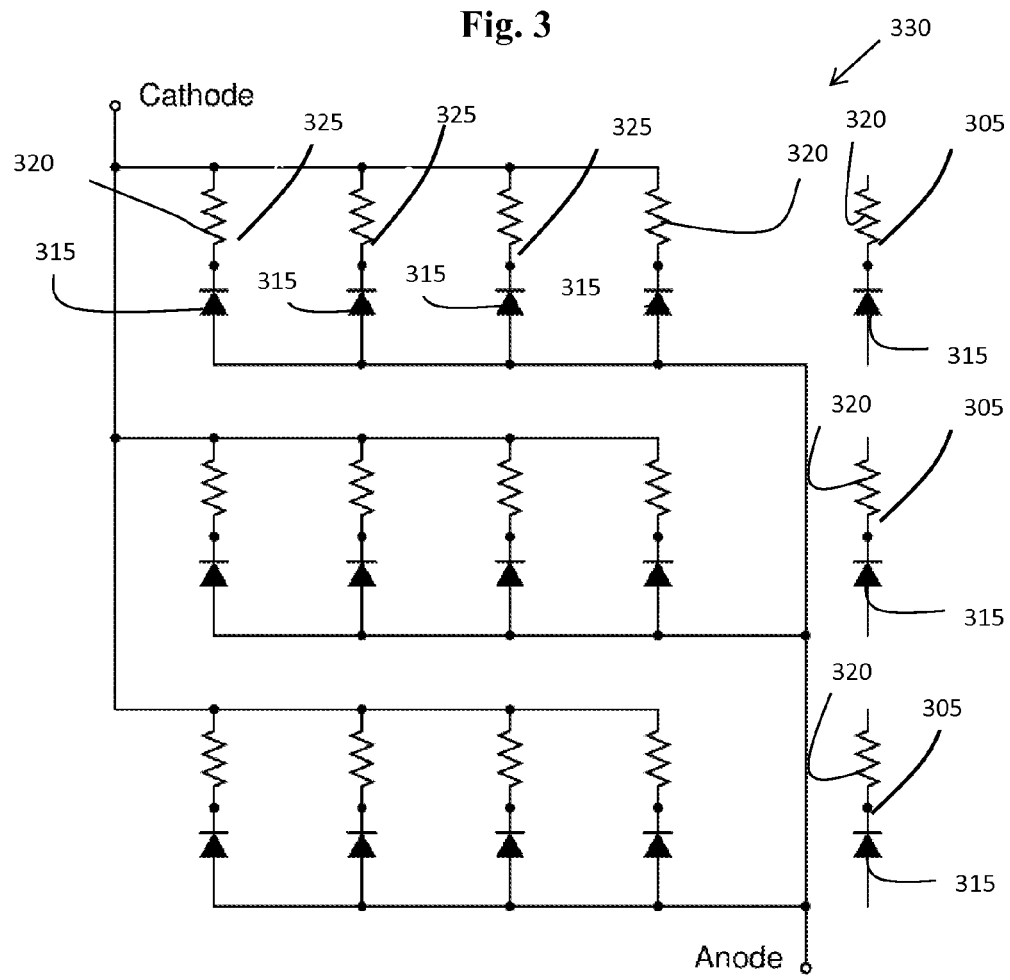
FIG. 4A is an exemplary schematic circuit diagram of a portion of a photomultiplier.

The present disclosure provides a semiconductor photomultiplier device 300 which includes an circuit 330 of interconnected photosensitive microcells 325 as illustrated in FIG. 4A. It will be appreciated by those of ordinary skill in the art that only a section of the circuit 330 is illustrated in FIG. 4A. Adjacent the array there is provided DCR suppression elements (inactive microcells 305). The DCR suppression elements suppress the dark count rate of the neighbouring photosensitive microcells 325. In the exemplary arrangement, the DCR suppression elements are dummy unpowered microcells 305. The dummy microcells 305 define a discontinuous configuration which surrounds the array of active microcells 325. In the first example, each dummy microcell 325 comprises an avalanche photodiode 315 with a resistor 320 coupled in series. The active microcells 325 are arranged in a grid configuration. The dummy microcells 305 are arranged adjacent the outer periphery of the grid configuration defined by the active microcells 325. The active microcells 325 are electrically coupled between the cathode and anode power tracks. In contrast, the dummy microcells 305 are not electrically coupled to cathode or anode power tracks. Thus the dummy microcells are electrically isolated from the active microcells 325. Other implementations of dummy microcells may be implemented, including the use of select signals to make cells active or inactive cells and the use of lithographic mask options to isolate or otherwise alter the electrical properties of chosen microcells to render them inactive.

Figure 4B:
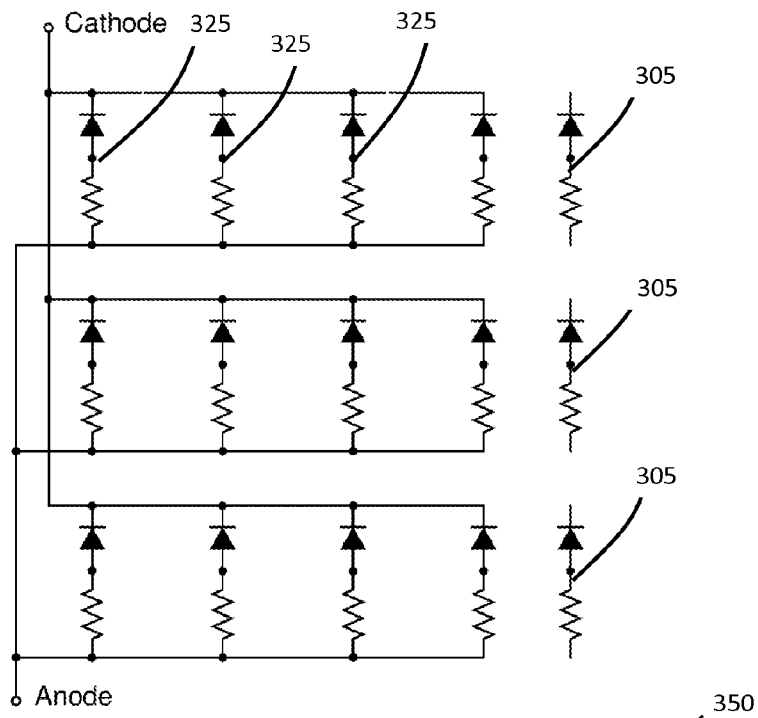
FIG. 4B is another exemplary schematic circuit diagram of a portion of a photomultiplier.

The active microcells 325 located at the outer edge of the grid configuration provide higher dark count rate due to the local variations in layer density than active microcells 325 located towards the centre of the grid. Thus, the dark count noise contribution of each microcells 325 depends on its location in the grid. The active microcells 325 located at the periphery of the grid contribute significantly more dark count noise than those microcells 325 that have neighbouring microcells 325 on each of its sides. Thus, the present inventors have realised that the edge microcells 325 are noisy because they do not have a neighbouring microcell 325 adjacent one of its sides. The present disclosure addresses this problem by locating dummy microcells 305 adjacent the edge microcells. The effect of the higher dark count rate is significantly reduced by providing DCR suppression elements in the form of dummy microcells 305 which at least partially emcompasses (surround) the active microcells 325. The introduction of dummy microcells 305 lowers the overall dark count rate from the silicon photomultiplier 300. FIG. 4B shows an alternative schematic circuit diagram for the photomultiplier 300 with the active microcells 325 having an alternative biasing configuration.

Figure 4C:
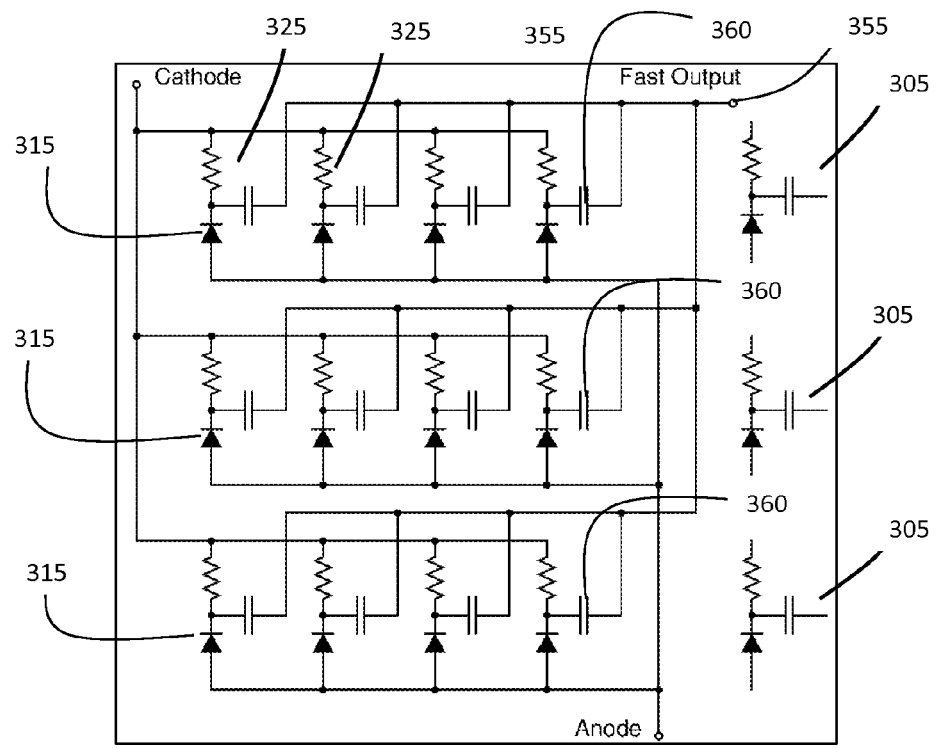
FIG. 4C is another exemplary schematic circuit diagram of a portion of a photomultiplier.
Figure 4D:
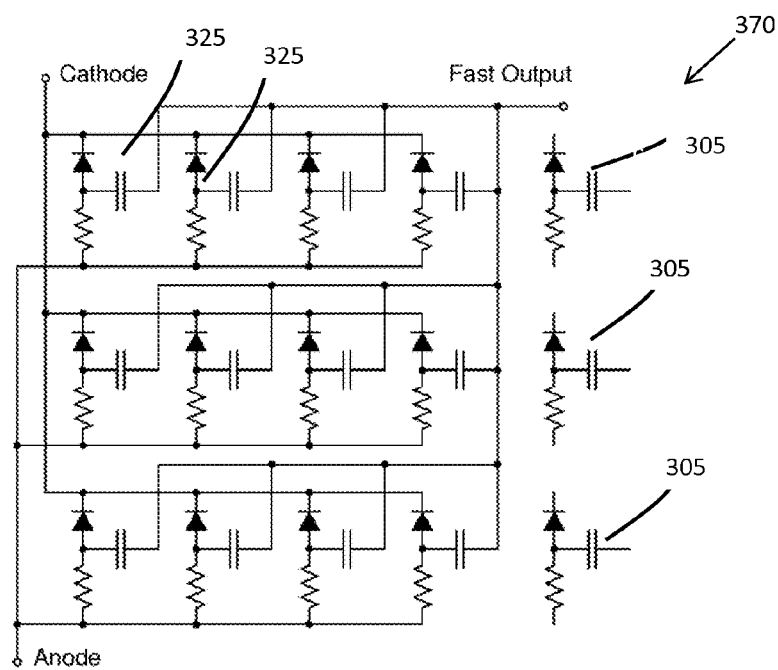
FIG. 4D is another exemplary schematic circuit diagram of a portion of a photomultiplier.
Figure 4E:
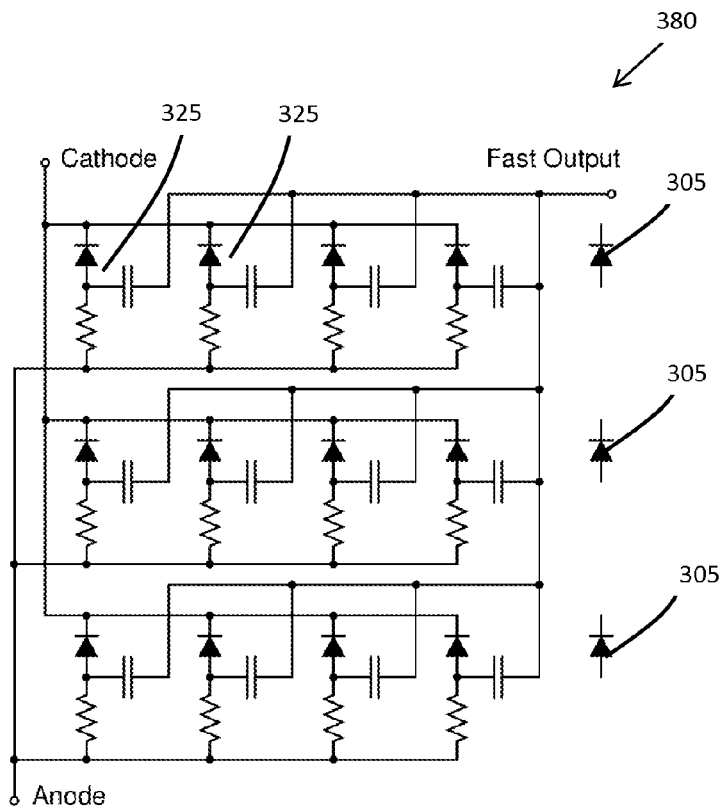
FIG. 4E is another exemplary schematic circuit diagram of a portion of a photomultiplier.

Referring now to FIG. 4C which illustrates an exemplary schematic circuit diagram 350 which may be utilised in the silicon photomultiplier 300 instead of the circuit 330. It will be appreciated by those of ordinary skill in the art that only a section of the array is illustrated in FIG. 4C. The circuit 350 has a third electrode 355 which is capacitively coupled to each photodiode cathode 310 in order to provide a fast readout of the avalanche signals from the photodiodes 315. When the photodiode 315 emits a current pulse, part of the resulting change in voltage at the cathode will be coupled via mutual capacitance 360 into the third electrode 355. Using the third electrode 305 for readout avoids the compromised transient performance resulting from the relatively large RC time constant associated with the biasing circuit. The dummy microcells 305 in this exemplary confirguation include a diode, resistor and a capacitor. FIG. 4D illustrates another exemplary schematic circuit diagram 370 which may be utilised in the silicon photomultiplier 300 instead of the circuit 350. The circuit 370 is substantially similar to the circuit 350 except an alternative biasing configuration is used for the active microcells 325. FIG. 4E illustrates another exemplary schematic circuit diagram 380 which may be utilised in the silicon photomultiplier 300 instead of the circuit 370. The circuit 380 is substantially similar to the circuit 370 with the exception that each dummy microcell 305 includes a single diode.

Figure 4F:
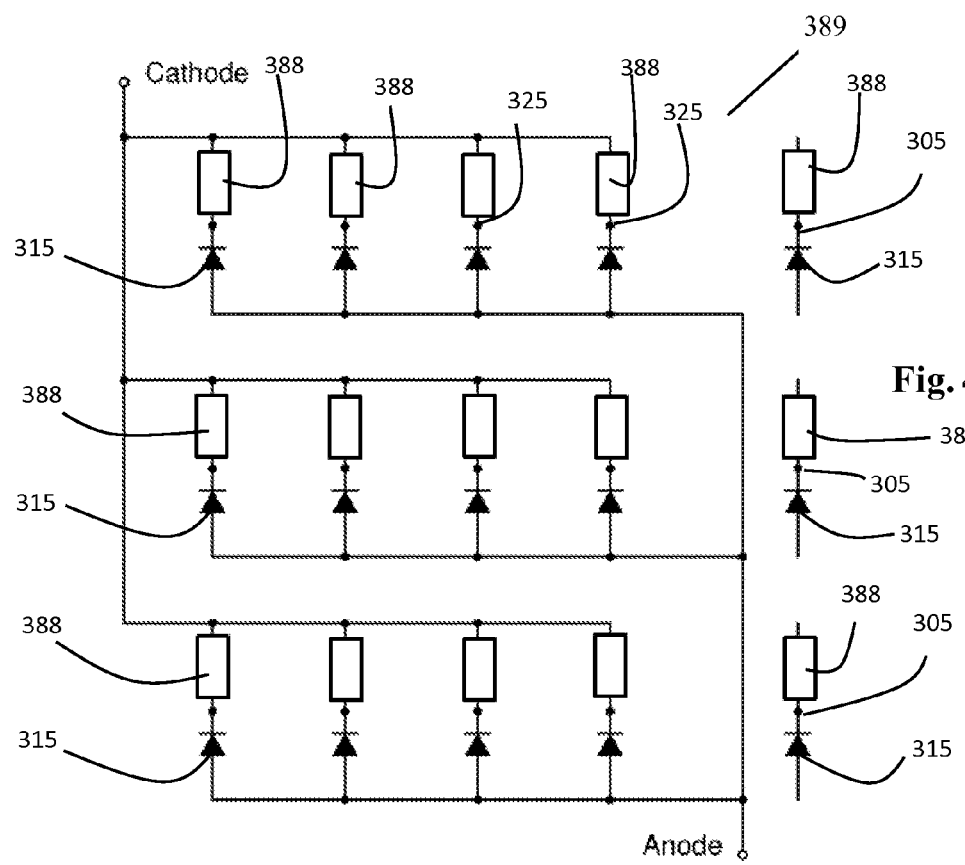
FIG. 4F is another exemplary schematic circuit diagram of a portion of a photomultiplier.

FIG. 4F illustrates another exemplary schematic circuit diagram 389 which may be utilised in the silicon photomultiplier 300. The circuit 389 is substantially similar to the circuit 300 with the exception that each dummy microcell 305 includes a diode 315 and a circuit component 388. Also each of the active microcells 325 includes a diode 315 and a circuit component 388. In the active microcells 325 the circuit component 388 is configured to limit the avalanche current from the associated diode 315.

Figure 5:
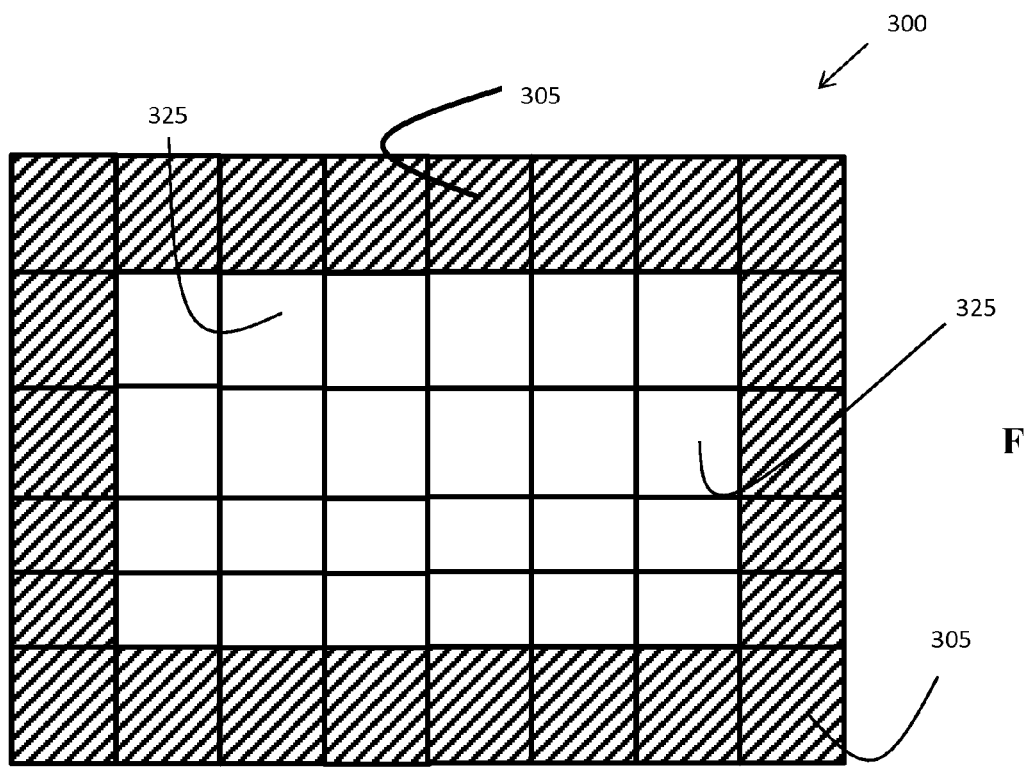
FIG. 5 is a plan view of an exemplary photomultipier in accordance with the present teaching.
Figure 6:
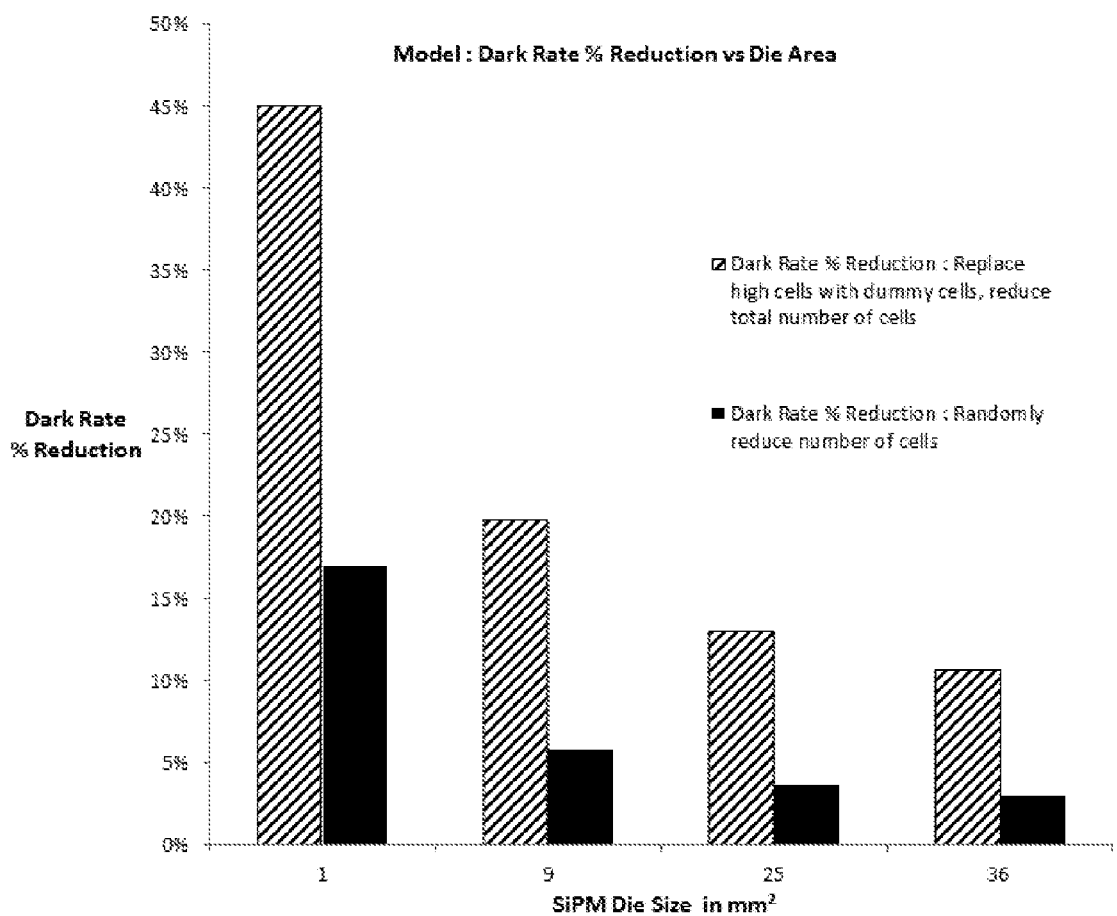
FIG. 6 is a bar chart illustrating a dark count rate reduction versus die area.

Referring to FIG. 5 which illustrates an exemplary layout plan for the semiconductor photomultiplier device 300 with a plurality of dummy microcells 305 located adjacent the grid of active microcells 325. The dummy microcells 305 surround the grid of active microcells so that the respective active microcells 325 have a neighbouring microcell at each of its four sides. It will be appreciated that the layout plan is not drawn to scale and that the number of microcells is reduced for illustration purposes. In an experiment, an exemplary 3 mm Silicon Photomultiplier (SiPM) device was modelled having 4774 microcells 325. In the device there were 276 edge microcells 325 and by converting these to dummy cells 305, the number of active microcells was reduced from 4774 to 4578, a reduction of 6%. The effect of converting the higher noise edge microcells to dummy microcells 305 and hence reducing their additive effect to the overall noise to zero was modelled, using typical measured values of key SiPM parameters (dark rate per unit area and gain) and known dimensions such as die size and number of microcells. The model output is illustrated in the bar chart of FIG. 6, where dark count rate % reduction is plotted for the case in which the high noise microcells are replaced with dummy microcells to mimic the case where the edge microcells have the highest dark rate, and also for the case where the number of microcells is randomly reduced. In each case the quantity dark rate % reduction is plotted against SiPM die size. The bar chart shows that the effect of reducing dark count rate noise by replacing the high noise edge microcells by dummy microcells is significantly greater that the effect of merely reducing the number of microcells, and that this reduction is most significant for smaller die size, as the ratio of edge die to non-edge die decreases as the die size increases. In the 3 MM SiPM case, where the die area is 3×3=9 mm$^2$, the dark rate % reduction is 20% for the case where the high noise edge microcells are replaced by dummy microcells, whereas by merely reducing the number of microcells by the same amount only leads to a dark rate reduction of 6%. Thus this highlights that edge microcells contribute significantly more DCR noise than centrally located microcells.

Figure 7:
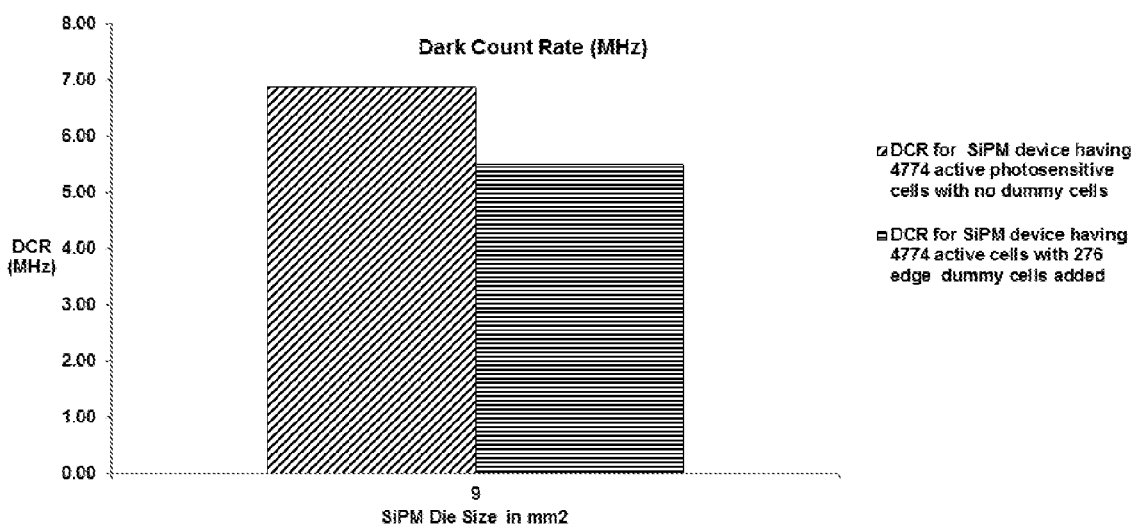
FIG. 7 is a bar chart illustrating a dark count rate reduction versus die area

Referring now to FIG. 7 an exemplary 3 mm Silicon Photomultiplier (SiPM) device was modelled initially with 4774 active microcell 325 and no dummy microcells 305 were provided. The SiPM device was then modelled to have 4474 active microcells and with 276 dummy cells arranged around the periphery of the active microcells in a similar fashion to that illustrated in FIG. 5. The model output is illustrated in the bar chart of FIG. 7, where dark count rate DCR for the two models is compared. The bar chart illustrates that by incorporating the dummy microcells around the edges of the grid of active microcells results in a significant reduction of the dark count rate.

Figure 8:
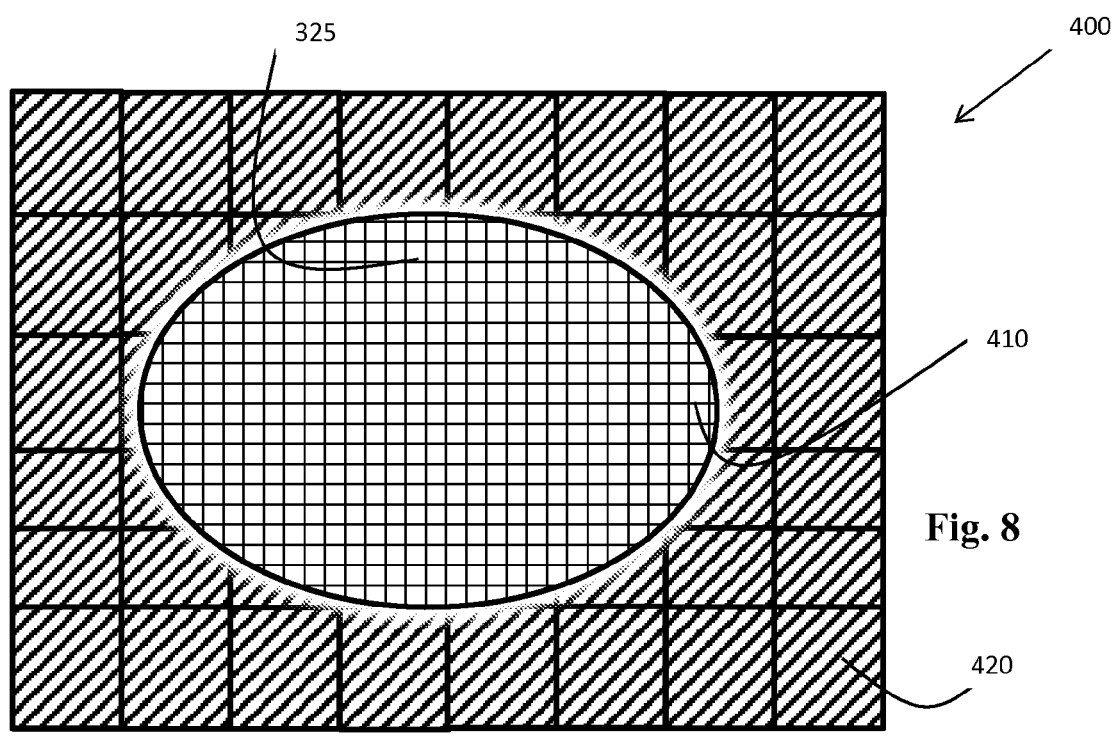
FIG. 8 is a plan view of another exemplary photomultiplier layout in accordance with the present teaching.

Referring to FIG. 8 there is provided a silicon photomultiplier 400 which is also in accordance with the present teaching. The photomultiplier 400 is similar to the photomultiplier 400 with the main difference being that the active microcells 325 define an active area 410 with a footprint shaped to conform with the footprint of a cross sectional area of an optical fibre. In the exemplary arrangement the footprint of the active region 410 is circular for facilitating coupling with the optical fibre. The dummy cells 305 define an inactive region 420. The effect of converting the higher noise edge microcells to dummy microcells 305 and hence reducing their additive effect to the overall noise to zero was modelled, using typical measured values of key SiPM parameters (dark rate per unit area and gain) and known dimensions such as die size and number of microcells. The result in this case, where approximately 22% of the cells are converted to dummy cells, including all of the edge cells which contribute the highest noise, is a reduction of 53% in overall dark rate, compared with a 22% reduction which would be expected from merely reducing the number of cells randomly.

Figure 9A:
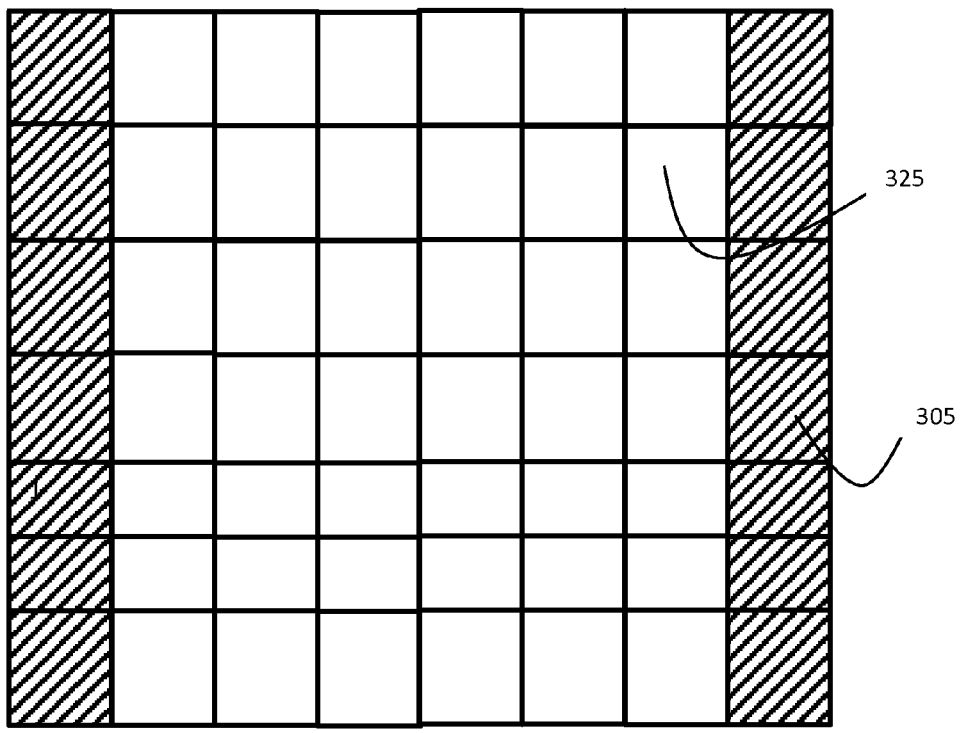
FIG. 9A is a plan view of a layout of an exemplary photomultiplier.
Figure 9B:
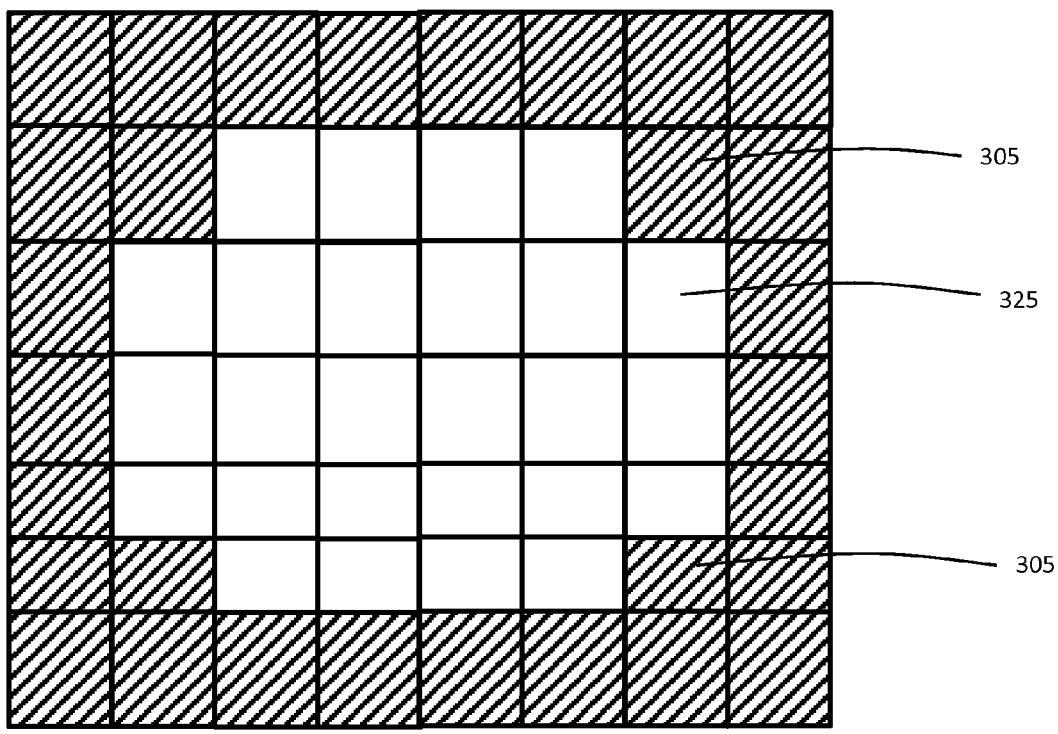
FIG. 9B is a plan view of a layout of an exemplary photomultiplier.

Referring to FIG. 9A which illustrates an exemplary layout plan for the semiconductor photomultiplier device 300 with a plurality of dummy microcells 305 located adjacent the respective opposite sides of the grid of active microcells 325. In this configuration, the dummy microcells are not arranged to fully surround the active microcells 325. Referring to FIG. 9B which illustrates an exemplary layout plan for the semiconductor photomultiplier device 300 with a plurality of dummy microcells 305 located adjacent the grid of active microcells 325. It has been found through experimentation that the active microcells 325 at the corners of the grid are the nosiest. Thus in order to reduce the dark count rate further the corner microcells are provided as dummy microcells 305 instead of being active microcells. In this way one or more additional DCR elements are associated with the corners of the grid configuration.

Figure 10A:
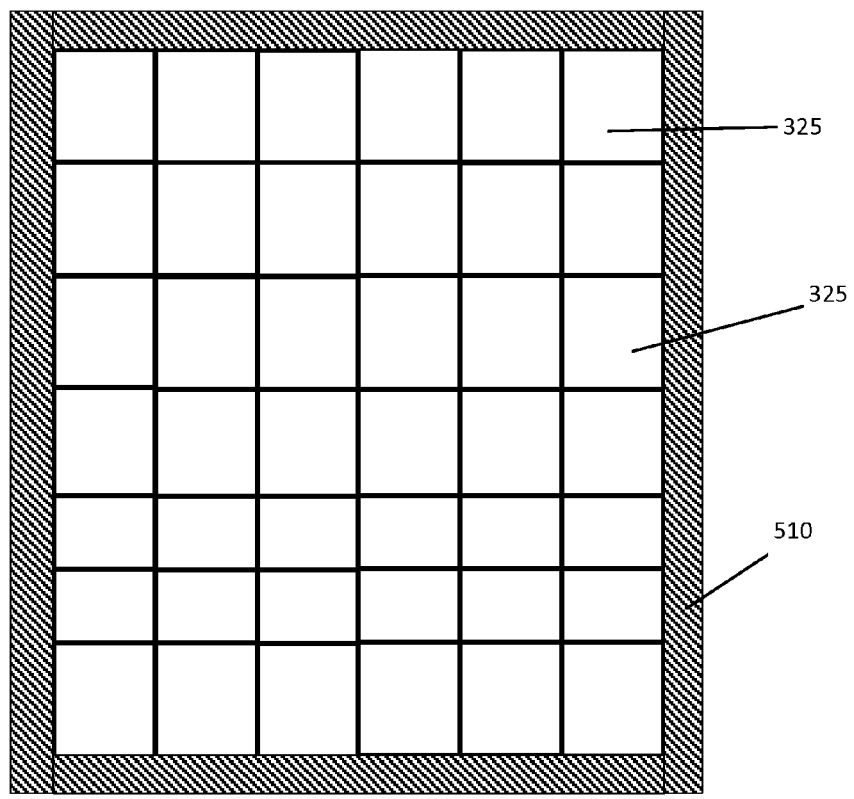
FIG. 10A is a plan view of a layout of an exemplary photomultiplier.
Figure 10B:
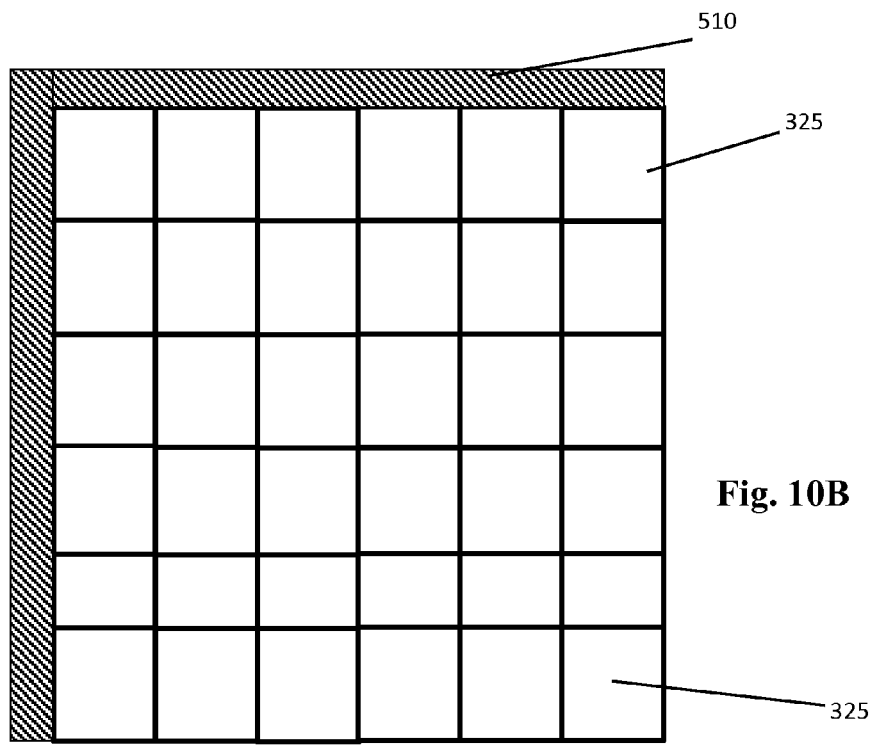
FIG. 10B is a plan view of a layout of an exemplary photomultiplier.

Referring to FIG. 10A which illustrates an alternative configuration whereby the noise suppression element is provided by a buried trench 510 filled with an insulating material such as silicon dioxide or silicon nitride, for example. In this exemplary arrangement the buried trench is continuous and completely surrounds the grid of active microcells 325. The configuration of FIG. 10B is similar to FIG. 10A with the exception that the buried trench only partially surrounds the grid of active cells. In the illustration two sides of the grid are surrounded by the buried trench 510.

Figure 11:
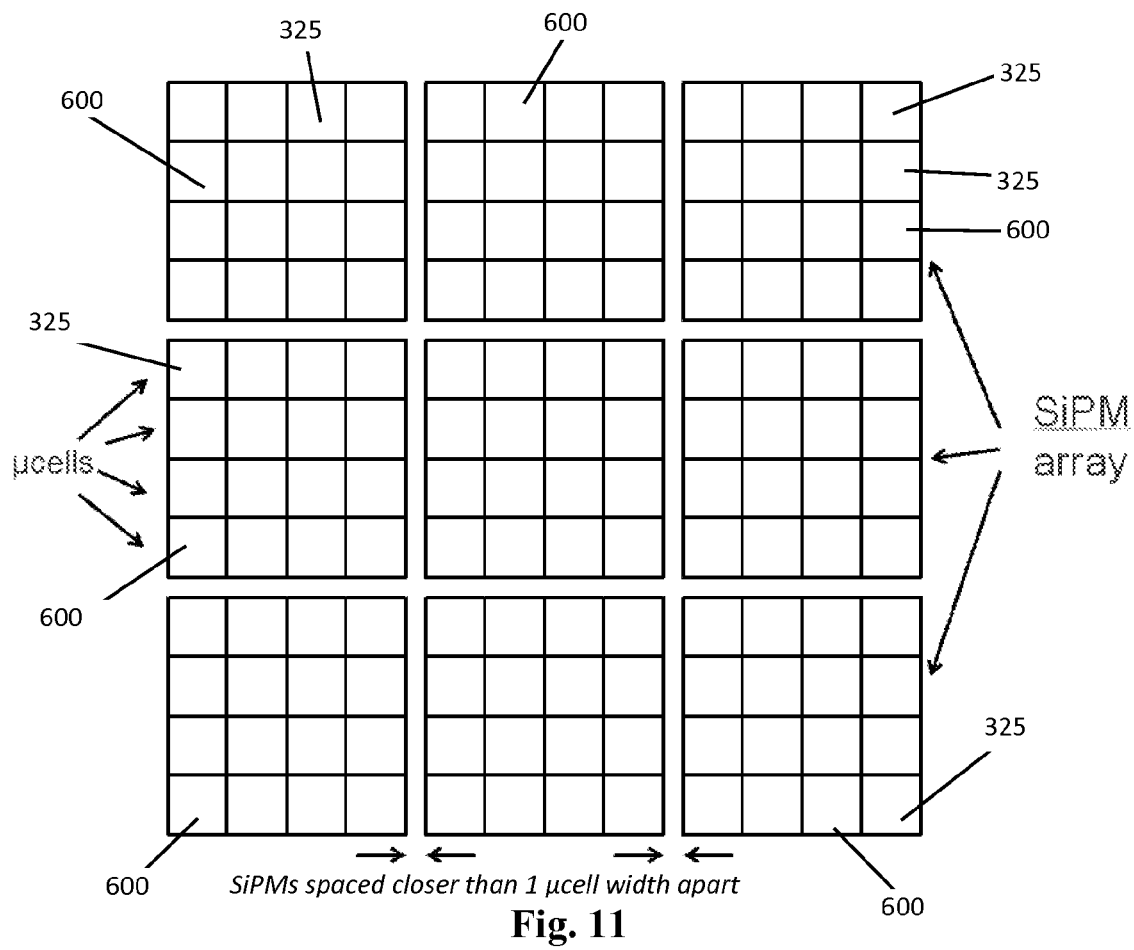
FIG. 11 is a plan view of a layout of an exemplary photomultiplier.

Referring to FIG. 11 which illustrates an exemplary floorplan illustrating a plurality of SiPM arrays 600 containing only active microcells 325. Thus no dummy microcells are provided. In this configuration the noise suppression element is achieved by tightly packing the SiPM arrays closely together. In the exemplary arrangement the the spacing between the microcells is less than the width of a single microcell 325. Thus the DCR suppression element is provided by spacing the discrete arrays apart from each other by a distance which is less than the width of a single microcell.

Figure 12:
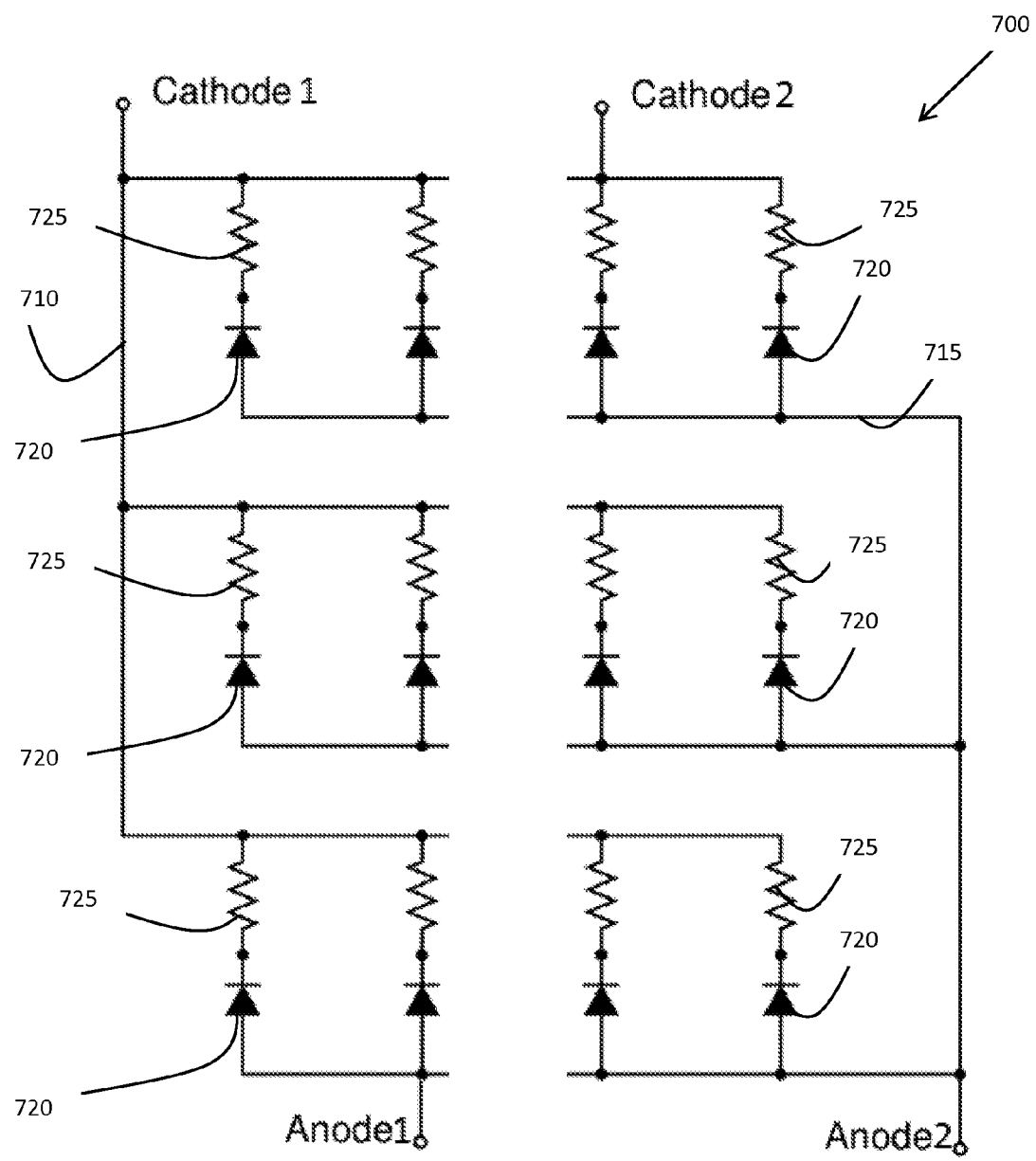
FIG. 12 is an exemplary schematic circuit diagram of an exemplary semiconductor photomultiplier in accordance with the present teaching.

Referring to FIG. 12 which illustrates a schematic circuit diagram of another semiconductor photomultiplier 700 which includes a first array 710 of interconnected photosensitive microcells and a second array 715 of interconnected photosensitive microcells. The first array 710 is operably coupled between the nodes anode 1 and cathode 1. The second array 715 is operably coupled between the nodes anode 2 and cathode 2. Each microcell in both arrays includes a photodiode 720 and a quench resistor 725. However, the photosensitive microcells could include alternative elements if desired. The first array 710 or the second array 715 are selectively powered to be either active or inactive. In one arrangement when the first array 710 is powered the second array 715 is not powered. In an alternative implementation when the second array 715 is powered the second array 710 is not powered. In this way it will be appreciated by those of ordinary skill in the art that by controlling the power to either anode 1 or anode 2 determines which array 710, 715 is active or inactive. The inactive array provides the dummy microcells which are then used the suppress the dark count rate of the active array. While only two arrays are illustrated it is not intended to limit the disclosure to the exemplary illustration as any desired number of arrays may be provided which can be selectively powered to be either active or inactive. Thus some of the plurality of DCR suppression elements are selectively controllable for configuring selected elements to be dummy elements. The plurality of DCR suppression elements define multiple sub-arrays which are independently controllable. Each sub-array is operably coupled between a cathode node and an anode node and at least two sub-arrays are operably coupled between different cathode and anode nodes.

It will be appreciated by those of ordinary skill in the art that the silicon photomultiplier 300 may be fabricated on the substrate 302 using conventional semiconductor processing techniques and may include for example, but not limited to, deposition, implantation, diffusion, patterning, doping, and etching. Patterned layers of conducting material, insulating material and doped areas of semiconductor form the structure of the microcells. The method of fabrication may include the steps of providing a plurality of photosensitive cells on the substrate 302, and providing at least one DCR suppression element 302 associated with the array.

It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

We claim:

1. A semiconductor photomultiplier comprising:
an array of interconnected photosensitive microcells; and
a plurality of dark count rate (DCR) suppression elements associated with the array; wherein each DCR suppression element is a dummy electrical component that is not coupled to a power track and is electrically isolated from the array of interconnected photosensitive microcells; wherein the array of interconnected photosensitive microcells and the DCR suppression elements are configured to simultaneously receive light.

2. A semiconductor photomultiplier as claimed in claim 1, wherein the at least one DCR suppression element comprises a photosensitive element.

3. A semiconductor photomultiplier as claimed in claim 2, wherein the at least one DCR suppression element comprises a microcell.

4. A semiconductor photomultiplier as claimed in claim 3, wherein each microcell comprises a photodiode.

5. A semiconductor photomultiplier as claimed in claim 4, wherein each microcell comprises a resistor coupled in series to the photodiode.

6. A semiconductor photomultiplier as claimed in claim 5, further comprising a capacitive element.

7. A semiconductor photomultiplier as claimed in claim 3, wherein each microcell comprises a circuit element configured to limit avalanche current of a diode.

8. A semiconductor photomultiplier as claimed in claim 1, wherein the at least one DCR suppression element comprises a photosensitive cell which has the same layout as an individual interconnected photosensitive microcell.

9. A semiconductor photomultiplier as claimed in claim 8, wherein the photosensitive cells define an active area and the DCR suppression elements define an inactive area.

10. A semiconductor photomultiplier as claimed in claim 9, wherein the active area has a footprint shaped to conform with the footprint of a cross sectional area of an optical fibre.

11. A semiconductor photomultiplier as claimed in claim 10, wherein the active area has a circular footprint for facilitating coupling with the optical fibre.

12. A semiconductor photomultiplier as claimed in claim 1, wherein the plurality of DCR suppression elements are located in the array.

13. A semiconductor photomultiplier as claimed in claim 1, wherein the plurality of DCR suppression elements defines a discontinuous configuration which at least partially surrounds the array.

14. A semiconductor photomultiplier as claimed in claim 1, wherein the plurality of DCR suppression elements are dummy elements which are formed by photolithographic mask options to isolate or otherwise alter the electrical properties of chosen microcells to render them inactive.

15. A semiconductor photomultiplier as claimed in claim 1, wherein at least some of the plurality of DCR suppression elements are interconnected such that the at least some of the plurality of DCR suppression elements can be selected to be dummy elements while the photosensitive microcells are active.

16. A semiconductor photomultiplier as claimed in claim 1, wherein the plurality of DCR suppression elements define sub-arrays which are independently controllable.

17. A semiconductor photomultiplier as claimed in claim 16, wherein each sub-array is operably coupled between a cathode node and an anode node.

18. A semiconductor photomultiplier as claimed in claim 17, wherein at least two sub-arrays are operably coupled between different cathode and anode nodes.

19. A semiconductor photomultiplier as claimed in claim 1, wherein each DCR suppression element defines a continuous configuration.

20. A semiconductor photomultiplier as claimed in claim 1, wherein each DCR suppression element comprises a buried trench filled with an insulating material.

21. A semiconductor photomultiplier as claimed in claim 1, further comprising a plurality of discrete arrays of microcells.

22. A semiconductor photomultiplier as claimed in claim 21, wherein each DCR suppression element is provided by spacing the discrete arrays apart from each other by a distance which is less than the width of a single microcell.

23. A semiconductor photomultiplier as claimed in claim 1, wherein the interconnected photosensitive cells are arranged in a grid configuration.

24. A semiconductor photomultiplier as claimed in claim 23, wherein one or more additional DCR elements are associated with the corners of the grid configuration.

25. A semiconductor photomultiplier as claimed in claim 1, wherein the DCR suppression elements are arranged adjacent the outer periphery of the grid configuration.

26. A semiconductor photomultiplier as claimed in claim 1, wherein each photosensitive cell comprises an avalanche photodiode.

27. A semiconductor photomultiplier as claimed in claim 26, wherein each interconnected photosensitive cell comprises an quench resistor coupled in series to the avalanche photodiode.

28. A semiconductor photomultiplier as claimed in claim 27, wherein each interconnected photosensitive cell further comprises a capacitive element.

29. A substrate comprising:
an array of interconnected photosensitive microcells; and
a plurality of dark count rate (DCR) suppression elements associated with the array; wherein each DCR suppression element is a dummy electrical component that is not coupled to a power track and is electrically isolated from the array of interconnected photosensitive microcells; wherein the array of interconnected photosensitive microcells and the DCR suppession elements are configured to simultaneously receive light.

30. A method of fabricating a semiconductor photomultiplier; the method comprising:
providing a plurality of interconnected photosensitive cells on a substrate, and
providing a pluality of DCR suppression elements associated with the array; wherein each DCR suppression element is a dummy electrical component which is not coupled to a power track and is electrically isolated from the array of interconnected photosensitive microcells; wherein the array of interconnected photosensitive microcells and the DCR suppession elements are configured to simultaneously receive light.

31. A semiconductor photomultiplier comprising:
an array of interconnected photosensitive microcells operably coupled between cathode and anode power tracks; and
a plurality of dark count rate (DCR) suppression elements associated with the array; wherein each DCR suppression element is a dummy electrical component that is electrically isolated from the cathode and anode power tracks; wherein the array of interconnected photosensitive microcells and the DCR suppession elements are configured to simultaneously receive light.

\* \* \* \* \*